US012089382B2

(12) United States Patent
Dunn et al.

(10) Patent No.: US 12,089,382 B2
(45) Date of Patent: *Sep. 10, 2024

(54) DISPLAY ASSEMBLY WITH DIVIDED INTERIOR SPACE

(71) Applicant: Manufacturing Resources International, Inc., Alpharetta, GA (US)

(72) Inventors: William Dunn, Alpharetta, GA (US); Marcos Diaz, Alpharetta, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/609,478

(22) Filed: Mar. 19, 2024

(65) Prior Publication Data

US 2024/0268088 A1    Aug. 8, 2024

Related U.S. Application Data

(63) Continuation of application No. 17/533,609, filed on Nov. 23, 2021, now Pat. No. 11,968,813.

(51) Int. Cl.
H05K 7/20    (2006.01)

(52) U.S. Cl.
CPC ..... H05K 7/20972 (2013.01); H05K 7/20981 (2013.01)

(58) Field of Classification Search
CPC ........... H05K 7/20972; H05K 7/20981; H05K 7/20145; H05K 7/20954; H05K 7/20963;
(Continued)

(56) References Cited

U.S. PATENT DOCUMENTS 4,093,355 A    6/1978    Kaplit et al.
4,292,370 A    9/1981    Pekko
(Continued)

FOREIGN PATENT DOCUMENTS

AU    2011248190 B2    5/2011
AU    2014287438 B2    1/2018
(Continued)

OTHER PUBLICATIONS

Itsenclosures, Product Catalog, 2009, 48 pages.
(Continued)

*Primary Examiner* — Mandeep S Buttar
*Assistant Examiner* — Matthew Sinclair Muir
(74) *Attorney, Agent, or Firm* — Standley Law Group LLP; Jeffrey S. Standley; Adam J. Smith

(57) ABSTRACT

A display assembly with divided interior space includes a common passageway which fluidly connects passageways of first and second electronic display subassemblies where the common passageway and passageways of the electronic display subassemblies form, at least in part, a continuous airflow pathway for gas. A central septum extends within the common passageway to prevent the gas from directly traveling between a first portion and a second portion of the common passageway, defined, at least in part, by the central septum. Each of the portions of the common passageway are fluidly connected with the passageways of the first and second electronic display subassemblies.

20 Claims, 11 Drawing Sheets

(58) Field of Classification Search
CPC ........... H05K 7/20718; H05K 7/20727; H05K 5/0018
See application file for complete search history.

(56) References Cited

U.S. PATENT DOCUMENTS

| | | | |
|---|---|---|---|
| 4,327,803 A | 5/1982 | Muellejans et al. |
| 4,488,193 A | 12/1984 | Davis et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfeller |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |

(56) References Cited

U.S. PATENT DOCUMENTS

| | | |
|---|---|---|
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 * | 11/2019 | Dunn .................. G02F 1/13338 |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |
| 11,822,171 B2 | 11/2023 | Dunn et al. |
| 11,889,636 B2 | 1/2024 | Dunn |
| 11,934,054 B2 | 3/2024 | Dunn et al. |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020679 A1 | 1/2003 | Kojima et al. |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |

(56) References Cited

U.S. PATENT DOCUMENTS

| | | |
|---|---|---|
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0094039 A1 | 5/2005 | Kim et al. |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081366 A1 | 4/2006 | Chiu et al. |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0148609 A1 | 6/2008 | Ogoreve |
| 2008/0165496 A1 | 7/2008 | Kang et al. |
| 2008/0190210 A1 | 8/2008 | Harish et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0310065 A1 | 12/2009 | Dunn |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |

(56) References Cited

U.S. PATENT DOCUMENTS

| | | | |
|---|---|---|---|
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1* | 10/2013 | Dunn .................. F21V 29/67 362/97.3 |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1* | 9/2018 | Oh ................ H05K 7/20972 |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0096797 A1 | 3/2020 | Teragawa |
| 2020/0154597 A1 | 5/2020 | Dunn et al. |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1* | 12/2020 | Whitehead ............ G09F 9/3026 |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |

(56) References Cited

U.S. PATENT DOCUMENTS

| | | | |
|---|---|---|---|
| 2023/0164964 | A1 | 5/2023 | Dunn et al. |
| 2023/0200031 | A1 | 6/2023 | Dunn |
| 2023/0209786 | A1 | 6/2023 | Dunn |
| 2023/0345683 | A1 | 10/2023 | Dunn et al. |
| 2023/0359077 | A1 | 11/2023 | Dunn et al. |
| 2023/0422431 | A1 | 12/2023 | Dunn et al. |
| 2023/0422453 | A1 | 12/2023 | Dunn |
| 2024/0032238 | A1 | 1/2024 | Dunn et al. |

FOREIGN PATENT DOCUMENTS

| | | |
|---|---|---|
| AU | 2015253128 B2 | 3/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| EP | 3615978 B1 | 1/2024 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H11-68363 A | 3/1999 |
| JP | 11160727 | 6/1999 |
| JP | H11296094 A | 10/1999 |
| JP | 2000-10501 A | 1/2000 |
| JP | 2000131682 A | 5/2000 |
| JP | 3118907 B2 | 10/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2003-162228 A | 6/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006-330196 A | 12/2006 |
| JP | 2007003638 A | 1/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 10-2007-0048300 A | 5/2007 |
| KR | 1020070048294 | 8/2007 |
| KR | 10-1153923 B1 | 6/2012 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |

(56) References Cited

FOREIGN PATENT DOCUMENTS

| | | |
|---|---|---|
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |
| WO | WO2024/020185 A1 | 1/2024 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, Llc V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. V Manufacturing Resources International, Inc.*, Defendant's Amended Answer and Counterclaims to Plaintiff's First Amended Complaint, Filed Apr. 24, 2018, 240 pages.
*Civiq Smartscapes, LLC V. Manufacturing Resources International, Inc.*, Memorandum Order re "rear surface of the electronic display" term construction, Mar. 5, 2019, 3 pages.
United States International Trade Commission, *Manufacturing Resources International, Inc. v Samsung Electronics Co., Ltd et al.*, In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.

\* cited by examiner

DISPLAY ASSEMBLY WITH DIVIDED INTERIOR SPACE

CROSS-REFERENCE TO RELATED APPLICATIONS

This application is a continuation of U.S. application Ser. No. 17/533,609 filed Nov. 23, 2021, the disclosures of which are hereby incorporated by reference as if fully restated herein.

TECHNICAL FIELD

Exemplary embodiments relate generally to display assemblies with divided interior space, such as for increased cooling, and systems and methods for operating such display assemblies.

BACKGROUND AND SUMMARY OF THE INVENTION

Display assemblies often generate heat, such as from solar loading, ingestion of relatively warm ambient air, and/or powering of internal components such as a backlight. This results in a need to thermally manage such display assemblies, particularly when used in outdoor applications. It is known to provide back-to-back electronic displays with a common plenum, such as is provided in U.S. Pat. No. 8,373,841 issued Feb. 12, 2013, or a common heat exchanger, such as is provided in U.S. Pat. No. 8,351,014 issued Jan. 8, 2013. As energy and/or manufacturing efficiency demands increase, what is needed are display assemblies which provide efficient thermal management and/or which are capable of being manufactured in an efficient manner.

Display assemblies which are capable of being manufactured in an efficient manner and/or which provide efficient thermal management are provided. These display assemblies may include multiple electronic display subassemblies (hereinafter also "subassemblies"). Each of the multiple electronic display subassemblies may be mountable to a structural framework, such as so they face in substantially opposing directions. The subassemblies may be completely or substantially identical to reduce manufacturing complexity and/or the need to store or provide different types of subassemblies, such as for servicing or replacement, in exemplary embodiments.

Each of the subassemblies, in exemplary embodiments, may comprise a front passageway located between a rear surface of a cover and a front surface of an electronic display layer, an illumination device cavity located between a rear surface of the electronic display layer and a front surface of an illumination device, an open loop channel located between the rear surface of the illumination device and a front surface of a rear cover, a corrugated layer located within the open loop channel, one or more electronic components mounted to a rear surface of the rear cover, and/or one or more fans mounted to the rear surface of the rear cover, to name some non-limiting examples.

A common passageway may be provided between the subassemblies. The common passageway may be defined, at least in part, by rear surfaces of the subassemblies and inner surfaces of the structural framework in exemplary embodiments. A central septum may extend between rear surfaces of the subassemblies and within the common passageway. The central septum may extend at, or proximate to, a midline of the common passageway so as to divide the common passageway into approximately first and second halves though the central septum may be placed elsewhere. In this manner, crossover between circulating gas in the closed loop exiting a first one of the subassemblies and exiting a second one of the subassemblies may be at least substantially prevented within the common passageway. The central septum may serve to divide the common passageway into multiple portions. At least part of the central septum may extend at an angle relative to the rear surfaces of the subassemblies and/or inner surfaces of the structural framework to improve aerodynamics.

A side septum may extend within each portion of the common passageway, such as between an exit of a respective one of the subassemblies and an entrance to an opposing one of the subassemblies. The side septa may act as baffles. The side septa may force circulating gas to take a sinuous path between the subassemblies, increasing surface area and time for cooling. However, the central septum may substantially prevent such circulating gas from prematurely crossing over to another portion of the common passageway.

Heat exchangers may be provided within a space between a respective one of the side assemblies and the respective one of the side septa. In this manner, circulating gas exiting the respective one of the side assemblies, which may be relatively hot such as from solar loading for example, may be cooled by ambient air passing through the respective one of the heat exchangers.

Closed loop fans may each be provided at rear surfaces of the subassemblies, such as adjacent to an entrance to the front passageways of the side assemblies. The closed loop fans may be configured to force circulating gas through the various airflow passageways, such as part of a closed loop, when activated.

The side septa, central septum, closed loop fans, and/or heat exchangers may be mounted to the rear surfaces of the rear covers in exemplary embodiments. In other exemplary embodiments, one or more of the side septa, central septum, and/or heat exchangers may be mounted to the structural framework.

In the case of units having multiple subassemblies, such as two subassemblies positioned to face in substantially opposing directions, one of the two subassemblies may face the sun more directly at certain times, and thus pick up more heat. The second one of the subassemblies may not be as directly exposed to the sun at such times because it faces in substantially the opposite direction. Thus, passing circulating gas through the second one of the subassemblies may help to cool circulating gas heated when passed the first one of the subassemblies. In this manner, the second one of the subassemblies may act as a heat exchanger for the first one of the subassemblies.

Gas springs, or other movement facilitating and/or assisting devices may be located within the common passageway for moving the subassemblies between an opened position whereby the subassemblies extend away from the structural framework and at least a portion of the common passageway may be accessed, and a closed position, whereby the subassemblies are positioned adjacent to the structural framework and the common passageway is fully or partially sealed.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
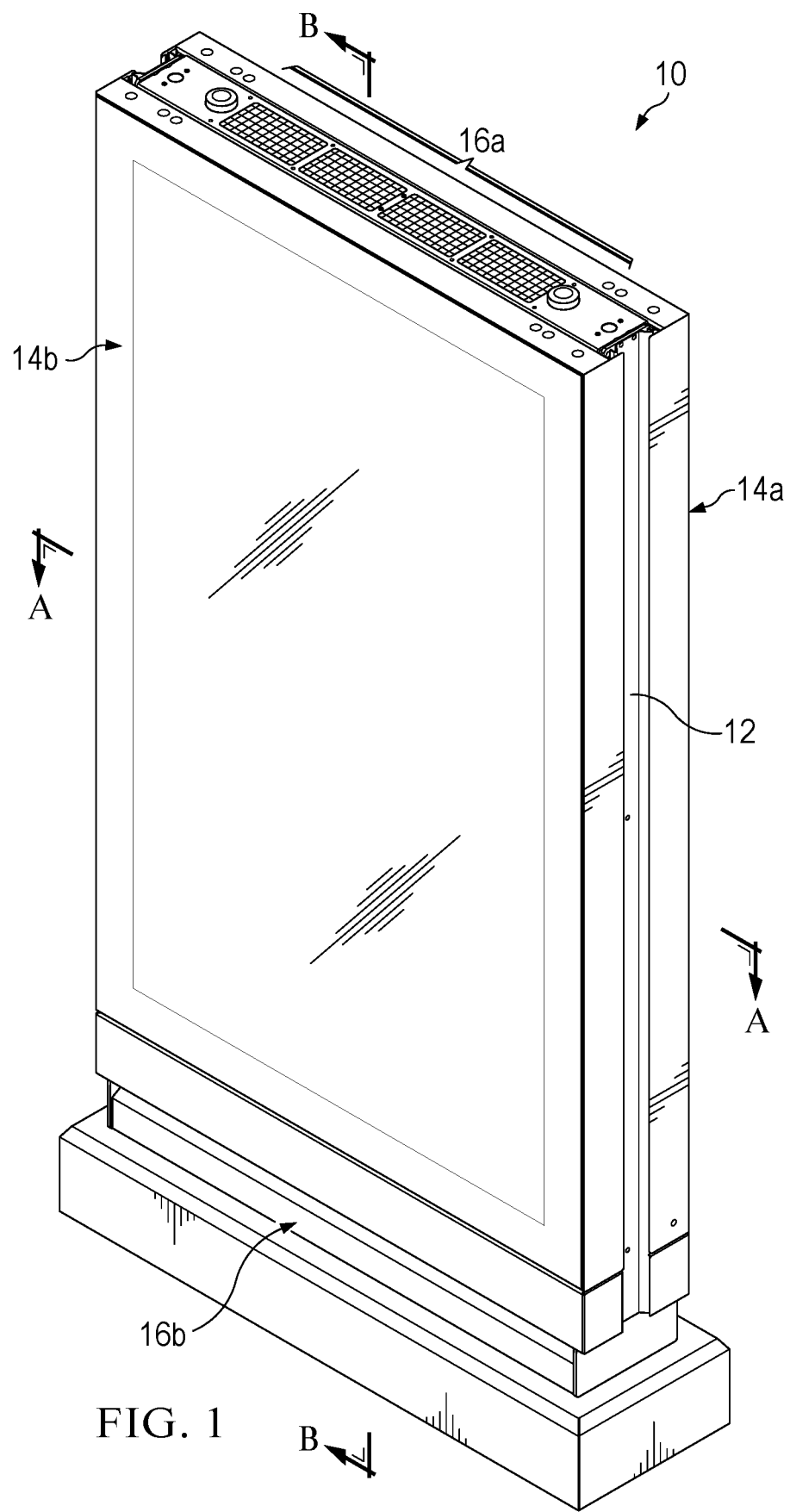
FIG. 1 is a perspective view of an exemplary display assembly in accordance with the present invention also indicating section lines A-A and B-B.
Figure 2:
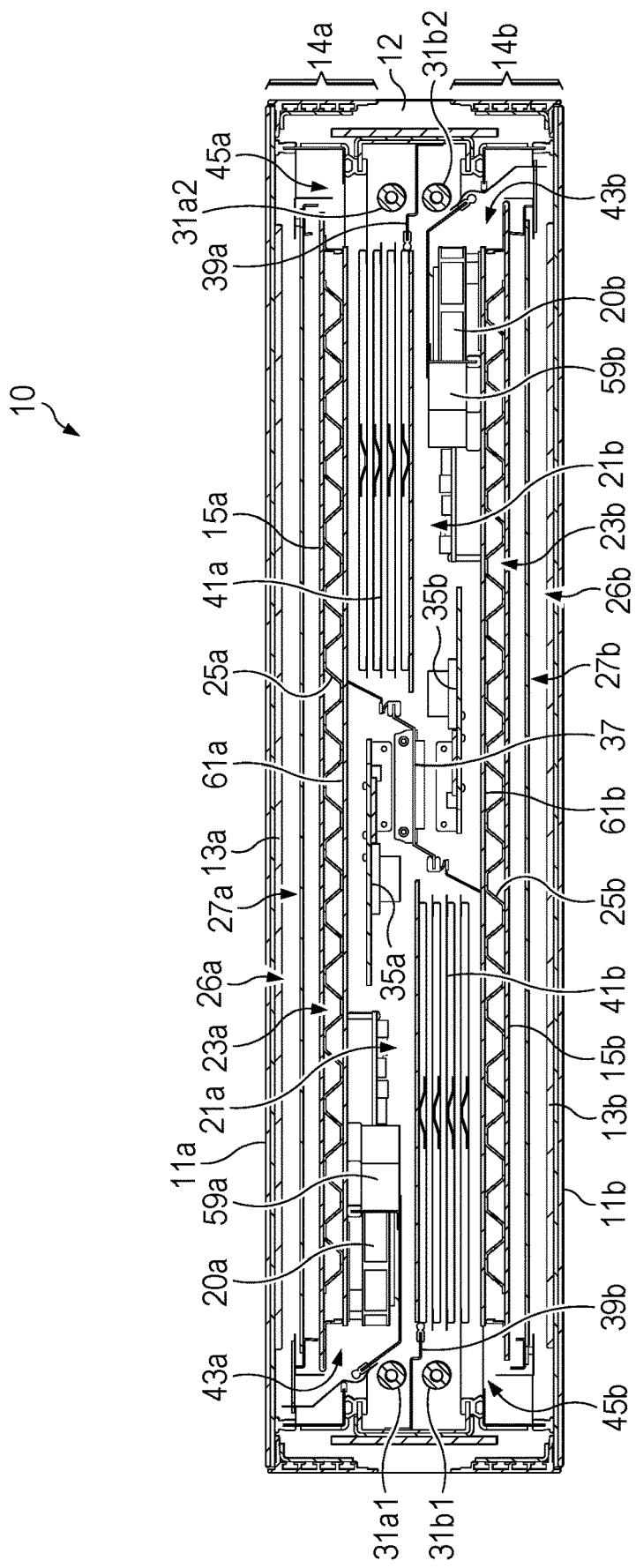
FIG. 2 is a top section view take along section line A-A of FIG. 1.
Figure 3:
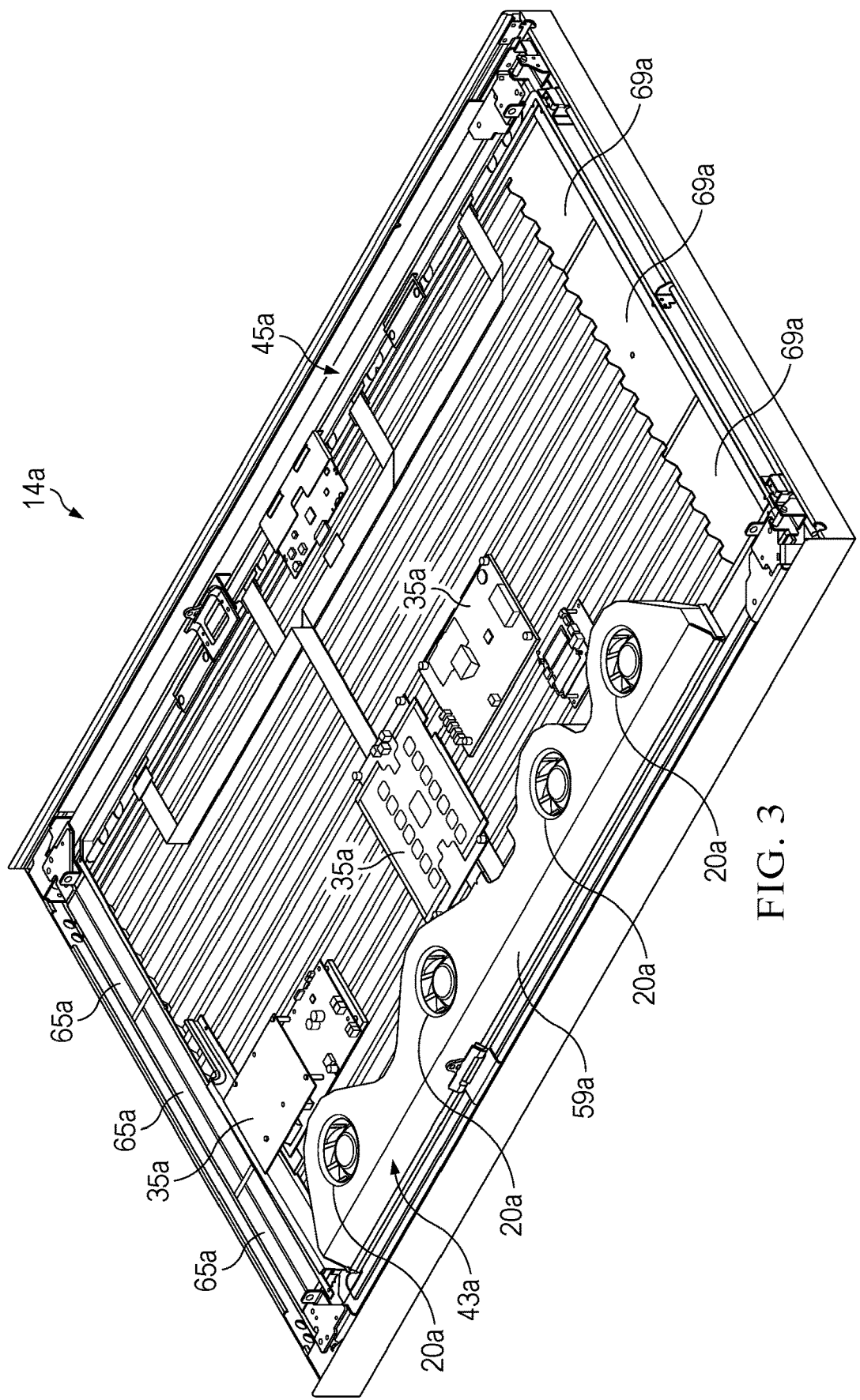
FIG. 3 is a rear perspective view of one subassembly of FIG. 1 shown in isolation.
Figure 4A:
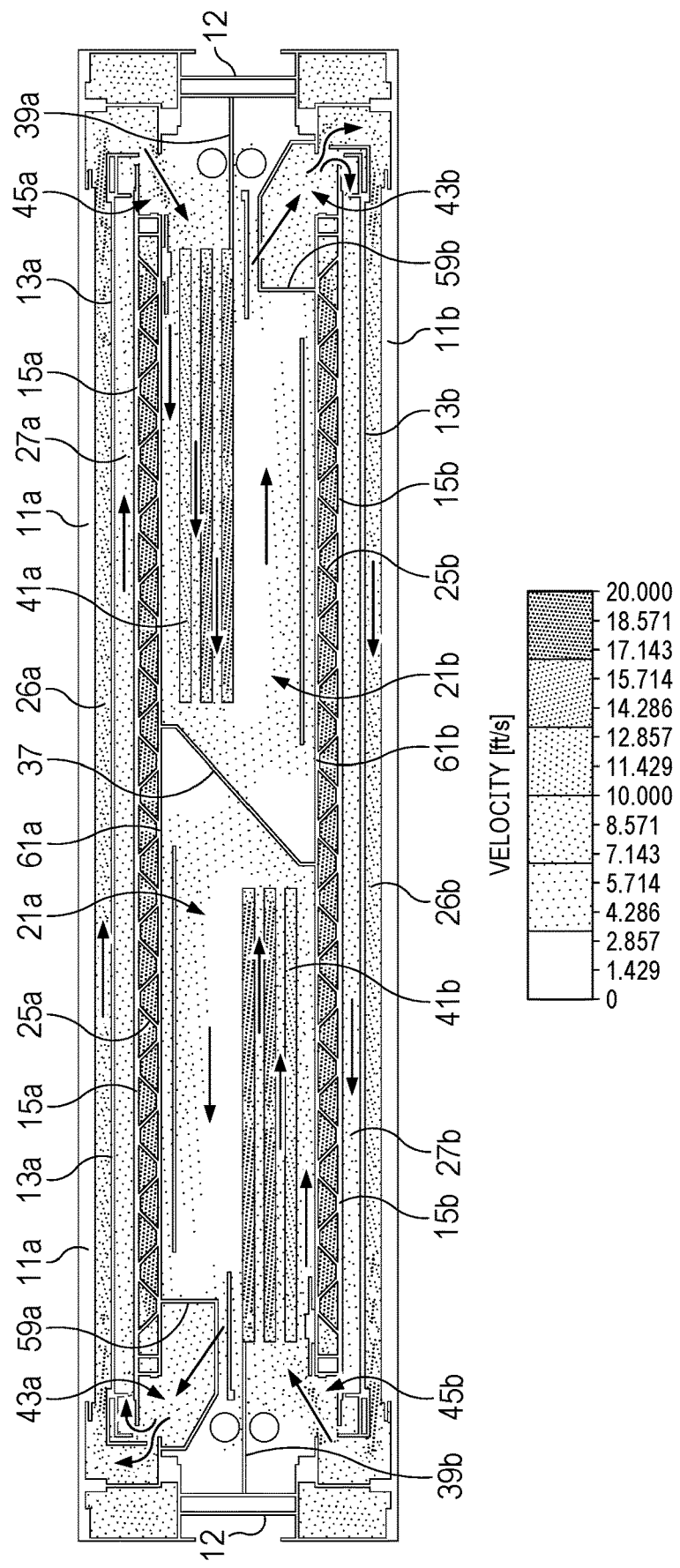
FIG. 4A is the top sectional view of FIG. 2 further illustrating exemplary airflow velocities.
Figure 4B:
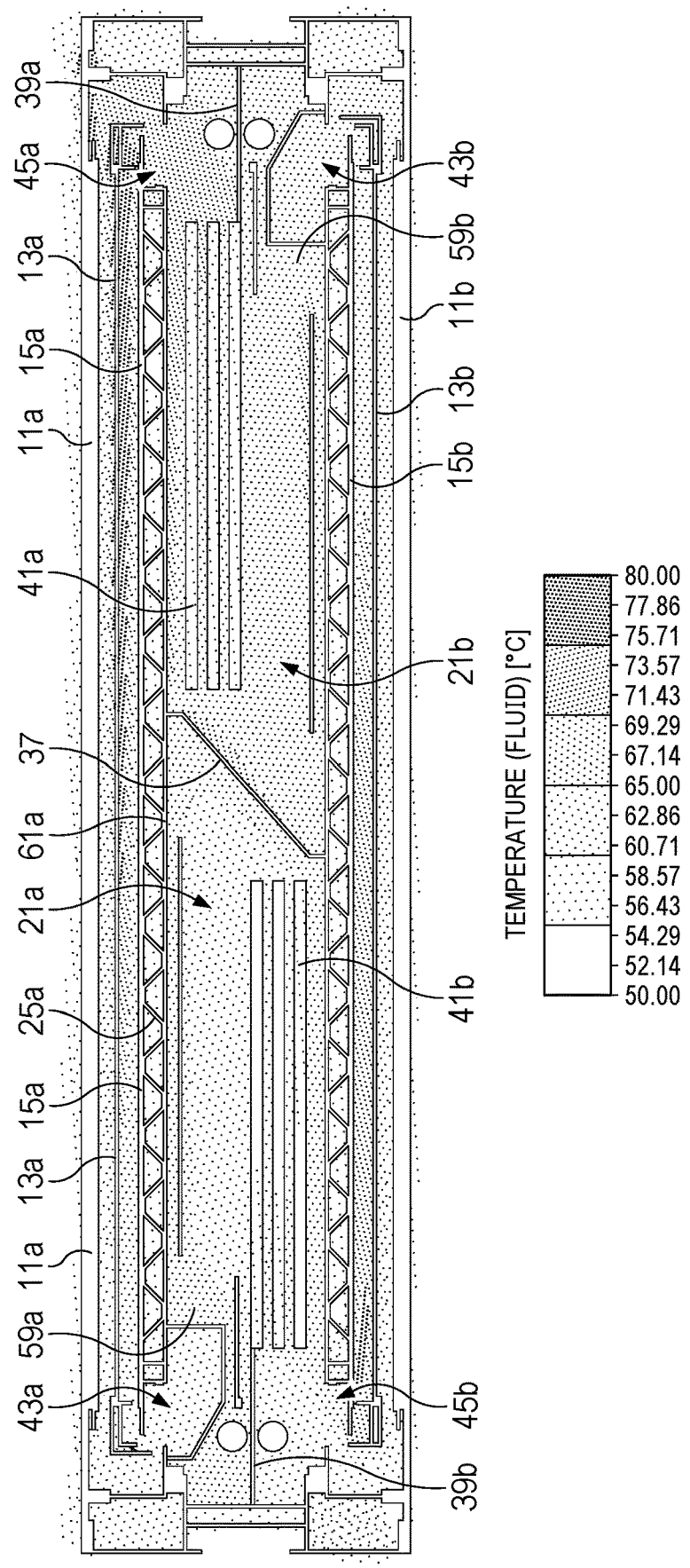
FIG. 4B is the top sectional view of FIG. 2 further illustrating exemplary airflow temperatures.
Figure 5:
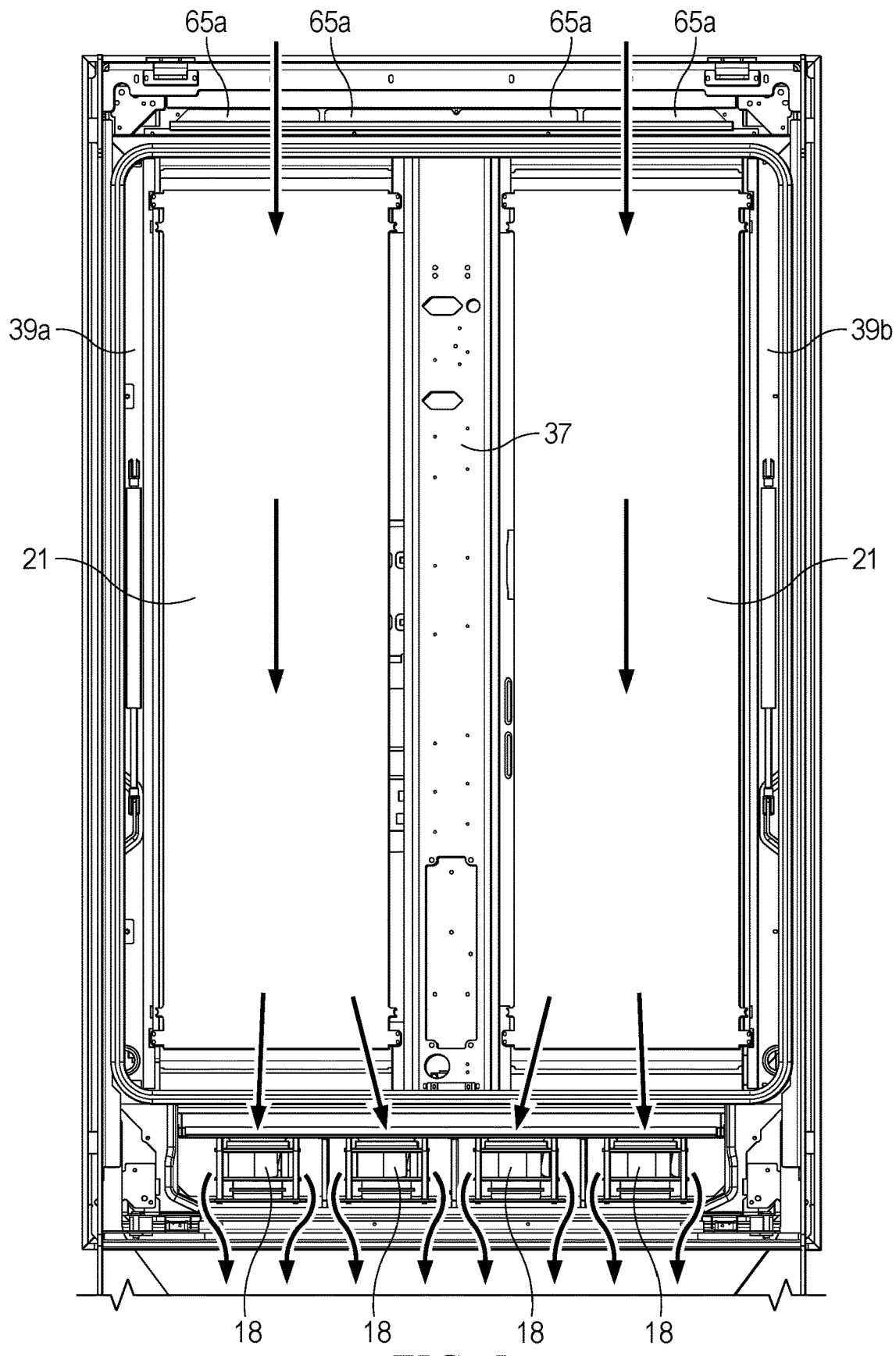
FIG. 5 is a detailed rear view of the display assembly of FIG. 1 with one of the subassemblies removed.
Figure 6:
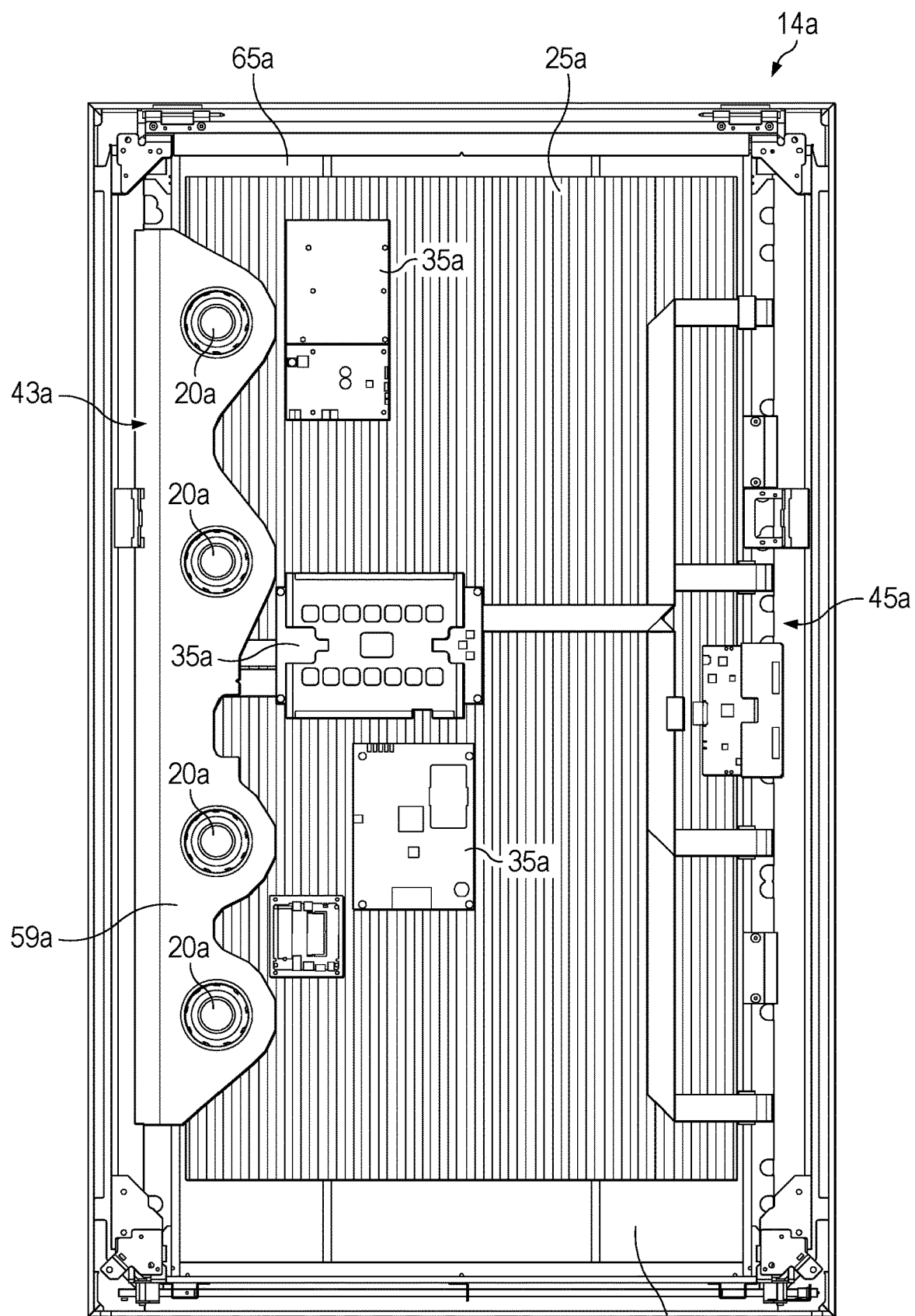
FIG. 6 is a rear view of the subassembly of FIG. 3.
Figure 7:
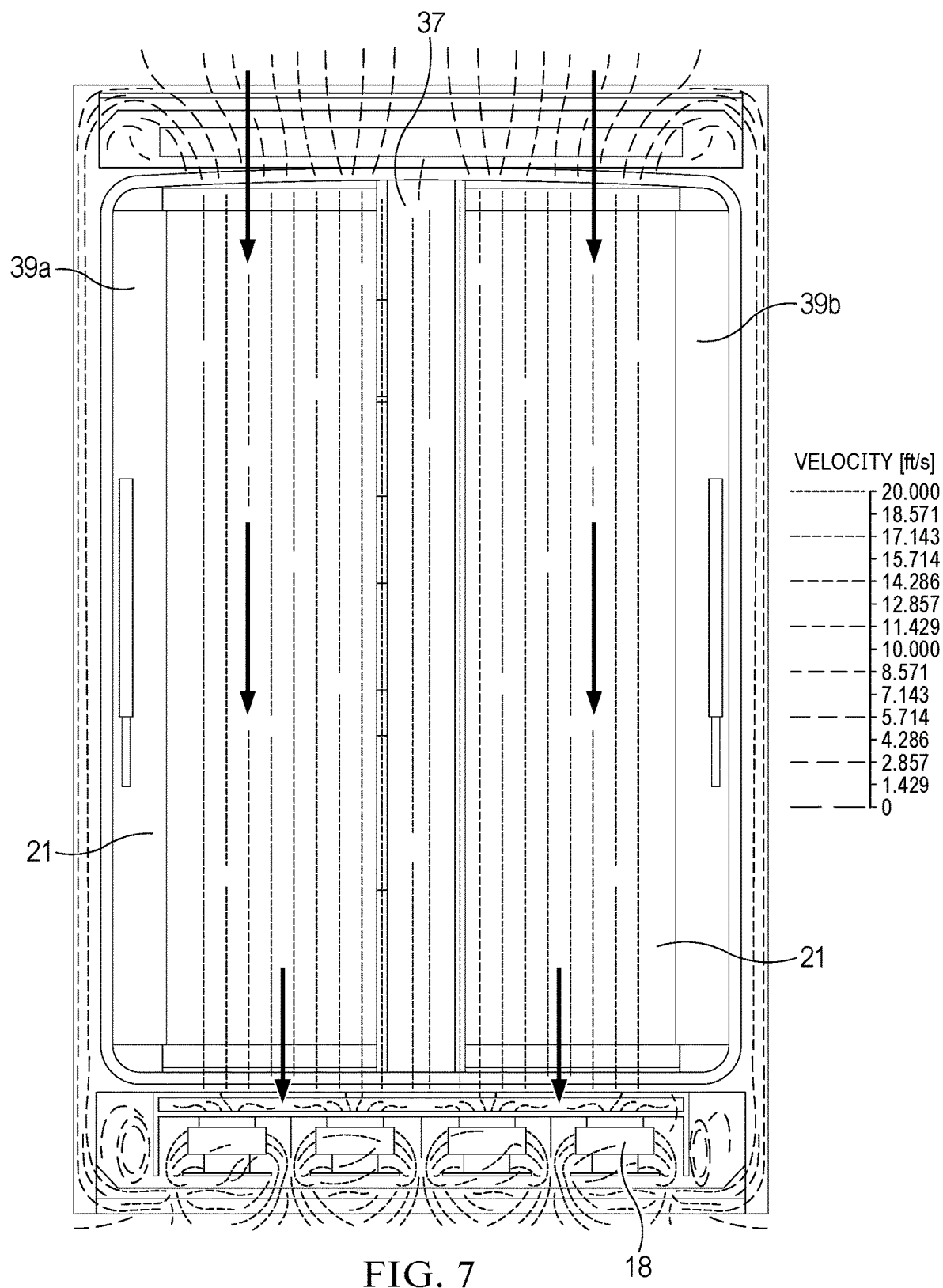
FIG. 7 is the detailed rear view of FIG. 5 further illustrating exemplary airflow velocities.
Figure 8A:
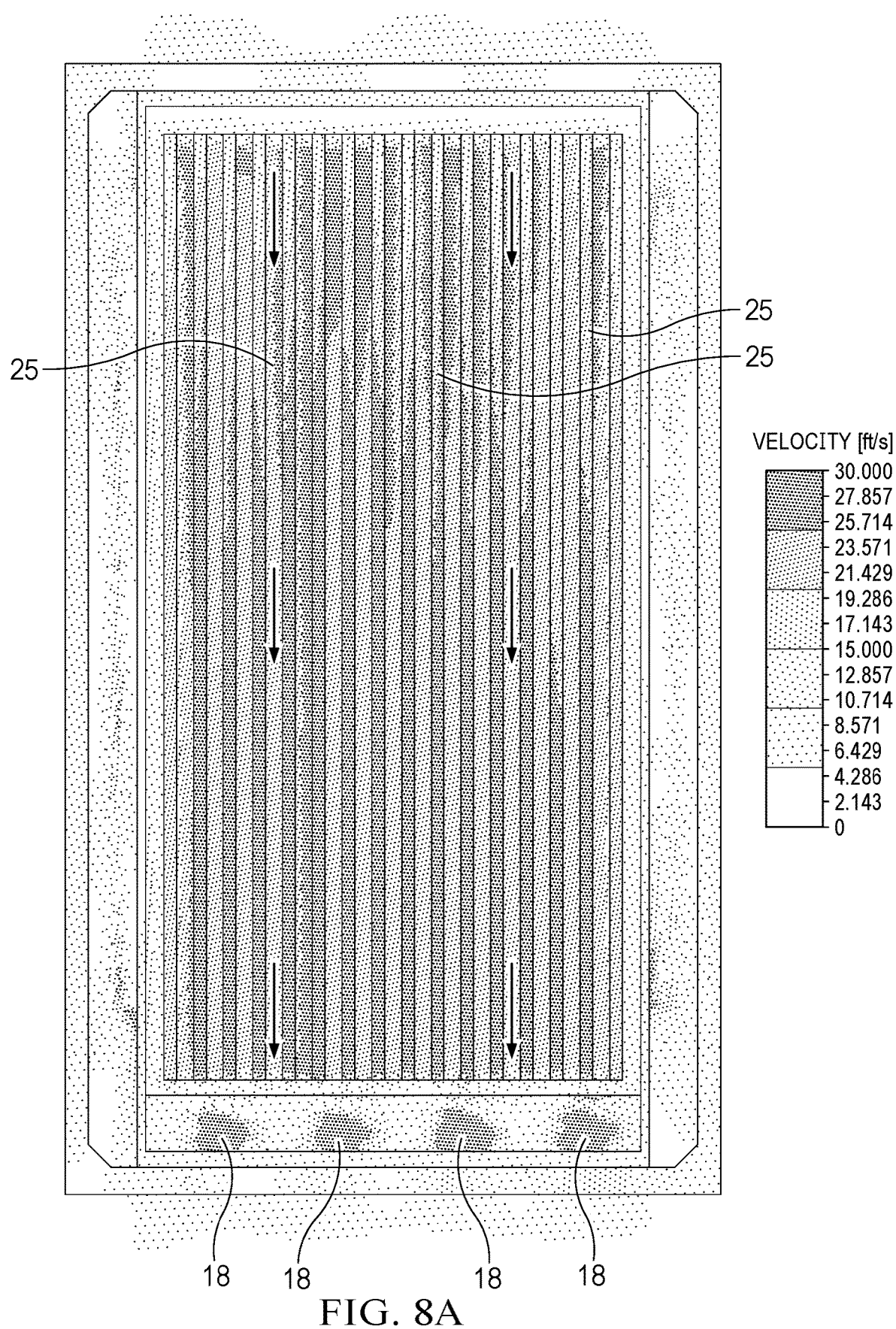
FIG. 8A is the rear view of the subassembly of FIG. 6 further illustrating exemplary airflow velocities.
Figure 8B:
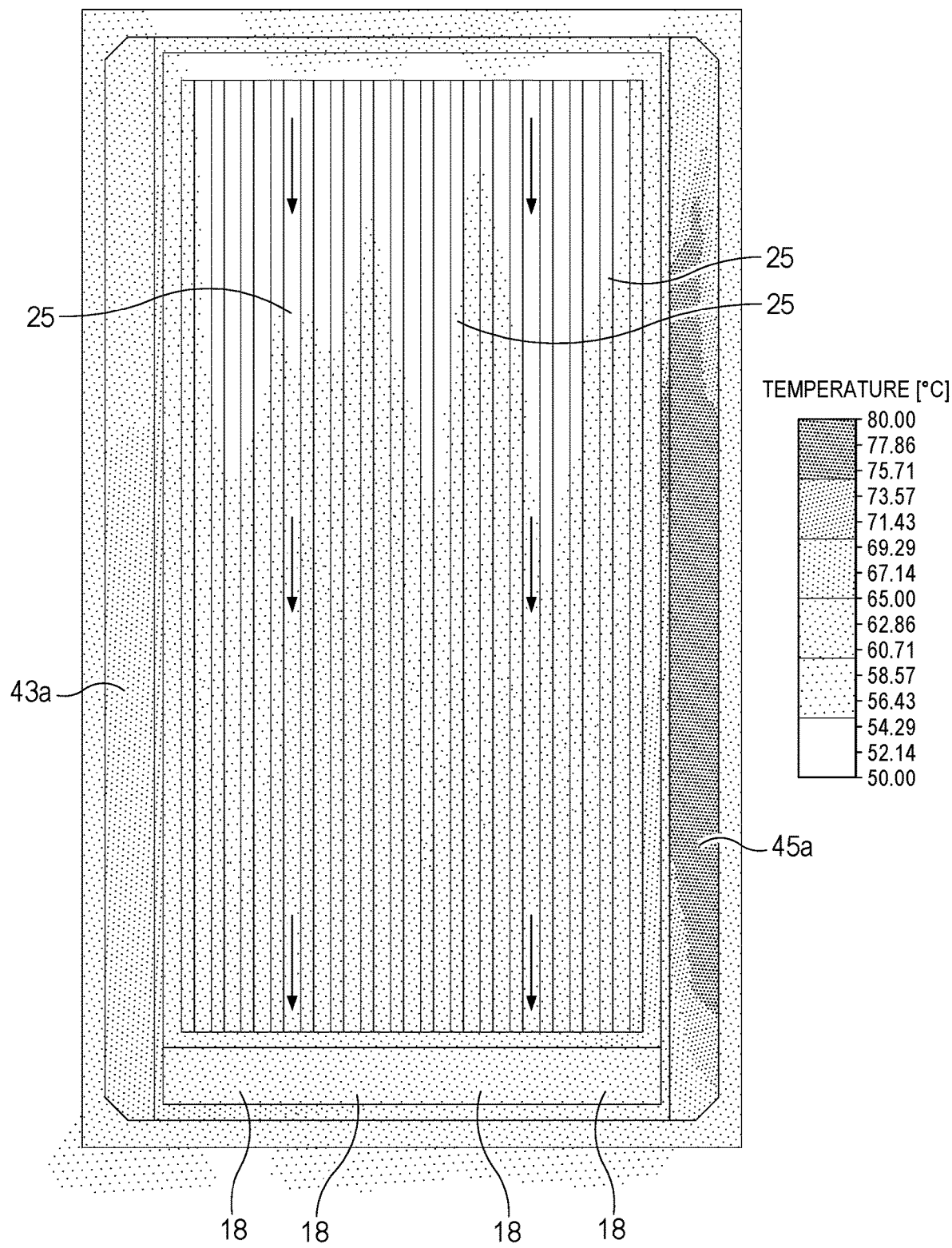
FIG. 8B is the rear view of the subassembly of FIG. 6 further illustrating exemplary airflow temperatures.
Figure 9:
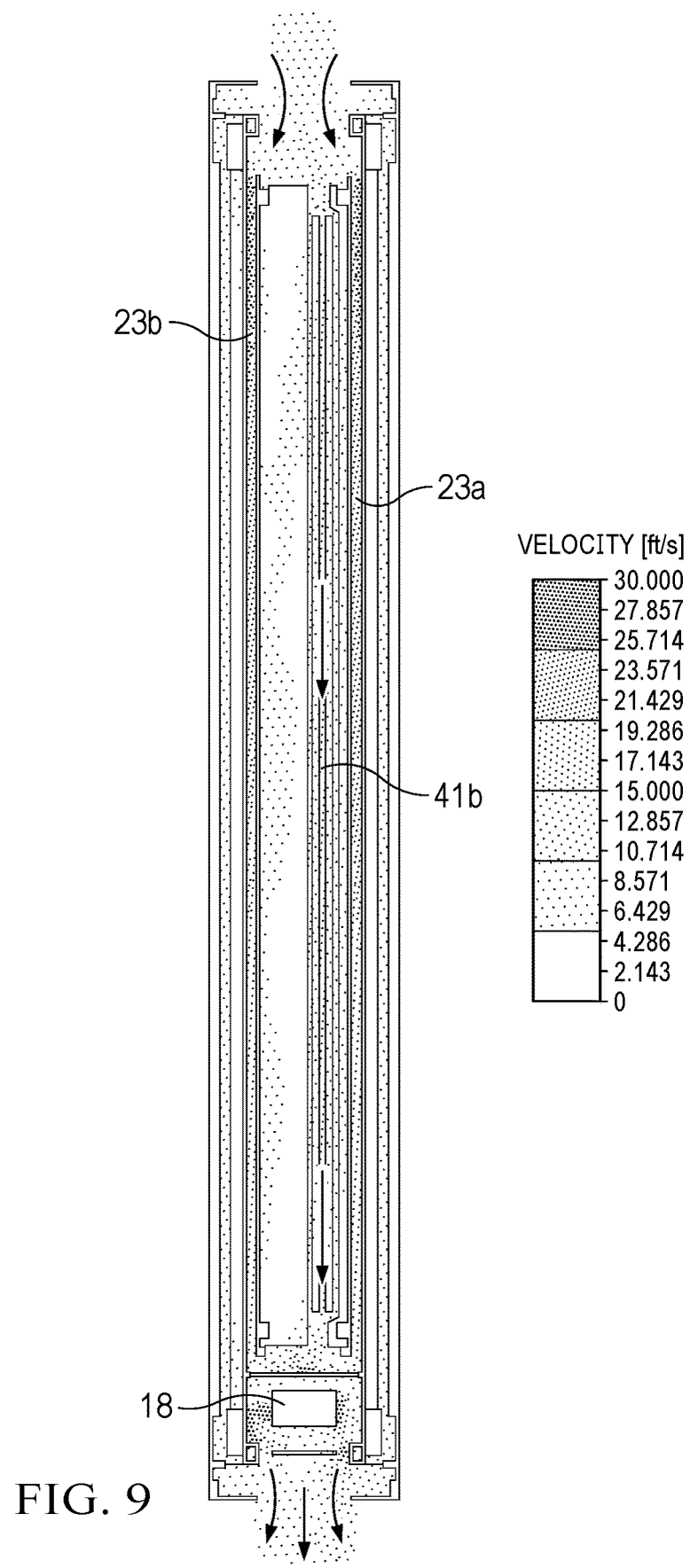
FIG. 9 is a side sectional view taken along section line B-B of FIG. 1 further illustrating exemplary airflow velocities.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, housings, combinations thereof, or the like. The structural framework 12 may comprise multiple components joined together.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework 12 in a hinged or otherwise moveable manner to permit selective movement between a closed position whereby certain parts of the units 10 are fully or partially sealed, and an open position whereby certain parts of the interior of the unit 10 are exposed for access. In exemplary embodiments, the units 10 may comprise a first and second electronic display subassemblies 14a, 14b placed on either side of the structural framework 12 such that the electronic display subassemblies 14a, 14b face in substantially opposing directions, for example.

One or more external openings 16 may be provided at the units 10 for ingesting and/or exhausting ambient air. In exemplary embodiments, a series of such openings 16a may be provided along an upper portion of the structural assembly 12, such as between the subassemblies 14, and may serve as intakes. In exemplary embodiments, another series of such openings 16b may be provided along a lower portion of the structural assembly 12 and may serve as exhausts. In exemplary embodiments, a set of one or more opening for exhausting air 16b may be provided below each of the subassemblies 14, and/or a single set of openings for ingesting air 16a may be common to some or all of the subassemblies 14. The openings 16 may be fully or partially covered with a screen, mesh, dust filter, vent, combination thereof, or the like.

FIG. 2 through FIG. 9 illustrate exemplary internal structures of the units 10 and the various subassemblies 14 as well as airflows through the same. While two electronic display subassemblies 14a, 14b placed in a back-to-back arrangement are shown, any number of electronic display subassemblies 14 may be utilized in any arrangement at the structural framework 12. Similar, or the same, components used in conjunction with units 10 having multiple electronic display subassemblies 14 may use the same numbering with the addition of an "a", "b" and/or "1", "2", etc. (e.g., 14 to 14a, 14b, 31a1 to 31a2). The use of a base number may refer to all such components (e.g., 14 to 14a, 14b).

Each electronic display subassembly 14 may comprise an illumination device 15. In exemplary embodiments, the illumination device 15 may comprise a number of lighting elements, such as LEDs, provided at a substrate, such as a printed circuit board and/or panel. Each electronic display subassembly 14 may comprise an electronic display layer 13. The electronic display layer 13 may comprise a layer of liquid crystals, such as for a liquid crystal type display, though any type or kind of electronic display may be utilized, including but not limited to, OLED, LCD, LED, plasma, cathode ray tube, rear projection, or the like. In exemplary embodiments, the illumination device 15 may be provided rearward of, and spaced apart from, the electronic display layer 13, such as to serve as a direct backlight. In other exemplary embodiments, the illumination device 15 may comprise one or more diffusive and/or transmissive layers and the substrate and/or lighting elements may be positioned about the edge of the electronic display layer 13 to provide edge lighting to the same. Alternatively, or additionally, one or more of the electronic display subassemblies 14 may comprise a cavity for a static poster instead of, or in addition to, to the electronic display layer 13 and/or a blank panel.

The illumination device 15 need not necessarily be located immediately behind the electronic display layer 13. For example, without limitation, one or more optical enhancement layers or films, diffusive elements, combinations thereof, or the like, may be interposed between the illumination device 15 and the electronic display layer 13, though such is not required. Furthermore, while the illumination device 15 may be spaced apart from the electronic display layer 13, such is not necessarily required.

The electronic display layer 13 and/or illumination device 15 of each subassembly 14 may be positioned rearward of a cover 11. The cover 11 may comprise one or more layers of a transparent or translucent material(s). In exemplary embodiments, each cover 11 may comprise two layers bonded with an optically clear adhesive, which may provide increased impact protection. One or more polarizers, anti-reflective materials, optical enhancement layers or films, combinations thereof, or the like may be disposed on some or all of various surfaces of the cover 11, such as but not limited to, in the form of various coatings, films, layers, combinations thereof, or the like. The cover 11 may form part of the electronic display subassembly 14 or may be separate therefrom. The cover 11 and the structural framework 12 may together substantially enclose the units 10, such as with external openings 16 exempted, when the subassemblies 14 are placed in a closed position. The cover 11 may be configured to move with the electronic display subassembly 14, may be configured for independent movement, and/or may be fixed to the structural framework 12. Each of the electronic display subassemblies 14 may be connected to the structural framework 12 in a hinged or otherwise movable manner, though such is not required.

The electronic display layer 13 need not necessarily be located immediately behind the cover 11. For example, without limitation, one or more optical layers may be interposed between the electronic display layer 13 and the cover 11, though such is not required. Furthermore, while the electronic display layer 13 may be spaced apart from the cover 11, though such is not necessarily required.

Multiple such electronic display subassemblies 14 may be provided at a given structural framework 12 for a given unit 10. For example, without limitation, two such subassemblies 14 may be mountable to opposing sides of the structural framework 12 so that the electronic display layers 13 face in substantially opposing directions, such as in a back-to-back arrangement. The electronic display subassemblies 14 may be of the same or different type and may comprise the same or different components. The electronic display subassemblies 14 and/or electronic display layers 13 may be provided in any arrangement such as portrait or landscape.

The external openings 16 may be fluidly connected to one or more subassembly airflow pathways 23. The subassembly airflow pathways 23 may extend through at least a portion of the units 10. A respective one of the subassembly airflow pathways 23a, 23b may extend through a respective one of the electronic display subassemblies 14a, 14b. The subassembly airflow pathways 23 may form part of an open loop airflow pathway, such that a flow of ambient air is provided through each one of the electronic display subassemblies 14. In exemplary embodiments, each of the subassembly airflow pathways 23 may share one or more common external openings for ingesting ambient air 16a. The ingested ambient air may be separated into flows through each of the subassembly airflow pathways 23 and may remain separated until exiting the unit 10, such as by way of separate external openings 16b in exemplary embodiments. For example, without limitation, the subassembly airflow pathways 23 may extend behind, and along at least a portion of, the illumination devices 15 for the electronic display layers 13. In this manner, cooling may be provided proximate to the illumination devices 15, which may be a significant heat generating component of the units 10.

Each of subassembly airflow pathways 23 may comprise one or more corrugated layers 25 in exemplary embodiments. The corrugated layers 25 may improve heat transfer from the illumination device 15 to ambient air in the subassembly airflow pathways 23 by increasing available surface area.

One or more closed loop airflow pathways may be provided within the units 10. In exemplary embodiments, such closed loop airflow pathways may include at least a front passageway 26a, 26b of each of the subassemblies 14a, 14b. The front passageway 26 may extend between the covers 11 and the electronic display layers 13 of the respective subassemblies 14. Such closed loop airflow pathways may alternatively, or additionally, comprise at least an illumination device passageway 27a, 27b of each of the subassemblies 14a, 14b. The illumination device passageways 27 may extend between each of the electronic display layers 13 and the illumination devices 15 of the respective electronic display subassemblies 14.

Various electronic components 35a, 35b for operating the subassemblies 14a, 14b, respectively, may be provided at rear panels 61a, 61b of the subassemblies 14a, 14b. In exemplary embodiments, the components 35 provided at a specific subassembly 14 may be utilized for operating that particular subassembly 14, though such is not necessarily required.

The rear panels 61a, 61b may be provided rearward of the illumination devices 15a, 15b and spaced apart therefrom to at least partially define the subassembly airflow pathways 23a, 23b and/or accommodate the corrugated layers 25a, 25b. Various components may be interposed between the rear panels 61 and the illumination devices 15, including but not necessarily limited to the corrugated layers 25, though such is not necessarily required.

The electronic components 35a, 35b may be located within a common passageway 21. The common passageway 21 may comprise a space or chamber located between the subassemblies 14 and/or the structural framework 12, and may be in fluid communication with the various subassemblies 14. The common passageway 21 may extend behind, and wholly or partially between, the electronic display subassemblies 14a, 14b. In exemplary embodiments, the common passageway 21 is in fluid communication with one or both of the front passageways 26 and the illumination device passageways 27 of the subassemblies 14. The common passageway 21 may be defined, at least in part, by said structural framework 12 and/or the subassemblies 14, such as by the rear panels 61.

The electronic components 35 may include, for example, without limitation, video players, power supplies, processors, electronic storage devices, controllers, sensors, combinations thereof, or the like. Any number, type, and/or kind of electronic components 35 may be utilized. The electronic components 35 may be configured to control other components of the unit 10. The electronic components 35a, 35b of a respective one of the subassemblies 14a, 14b may be configured to control components of the respective one of the subassemblies 14a, 14b, though such is not necessarily required.

The one or more closed loop airflow pathways may extend entirely within the units 10, such as within outer boundaries of the structural framework 12 and/or the electronic display subassemblies 14. The closed loop airflow pathway may comprise one or more of the common passageways 21, the front passageways 26, and/or the illumination device passageways 27.

In exemplary embodiments, a central septum 37 may extend within the common passageway 21 and between the subassemblies 14 to divide the common passageway 21 into multiple portions 21a, 21b. For example, without limitation, a single central septum 37 may extend between first and second subassemblies 14a, 14b of a unit 10 to divide the common passage 21 into substantially two equal halves. In other exemplary embodiment, multiple central septa 37 may be utilized, such as where additional subassemblies 14 are utilized. The central septum 37 may extend along substantially the midline of the common passageway 21 and substantially perpendicular to the display layers 13a, 13b of the subassemblies 14a, 14b. The central septum 37 may comprise one or more angled surfaces as it extends between the subassemblies 14. This arrangement may improve aerodynamics for airflow and/or make room for equipment or other components further described herein. The central septum 37 in exemplary embodiments may be fixed to portions of the structural framework 12, but not the subassemblies 14. This may, for example without limitation, make each subassembly 14 substantially or fully identical to improve ease of manufacture and/or servicing. In other exemplary embodiments, the central septum 37 is attached to one of the subassemblies 14a, 14b.

The central septum 37 need not necessarily provide a 100% division between the portions of the common passageway 21a, 21b, though such may be the case in certain exemplary embodiments. Instead, it may be sufficient that that the central septum 37 provide a substantial separation between the portions 21. For example, such that at least 90% of airflow is prevented from crossover between the portions 21 and/or such that particulate above a predetermined size is prevented from crossover between the portions 21.

One or more side septa 39 may be provided within the common passageway 21. In exemplary embodiments, one of the side septa 39a, 39b may be provided within each of the common passageway portions 21a, 21b. The side septa 39 may be fixed to the structural assembly 12 in exemplary embodiments. Each of the side septa 39 may extend substantially parallel to the electronic display layers 13 of the subassemblies 14. Each side septa 39a, 39b may extend part of the way into the respective common passageway portions 21a, 21b. In this fashion, circulating gas within the units 10 may be forced to navigate about the side septa 39, which may increase dwell time within the common passageway portions 21 and/or increase surface area available for heat transfer.

One or more heat exchangers 41 may be provided between the subassemblies 14. In exemplary embodiments, one of the heat exchangers 41a, 41b may be provided within each of the common passageway portions 21a, 21b. The heat exchangers 41 may be affixed to the side septa 39 in exemplary embodiments. Each of the heat exchangers 41a, 41b may extend between a respective one of the rear panels 61a, 61b and a respective one of the side septa 39a, 39b and be located entirely within one of the common passageway portions 21a, 21b. In this manner, the circulating gas may be forced through portions of the heat exchangers 41 for added cooling. The heat exchangers 41 may accommodate ambient air and may be in fluid communication with the external openings 16. In other exemplary embodiments, the heat exchangers 41 may not be utilized. In exemplary embodiments, the heat exchanger(s) 41 may comprise multiple layers or portions which are fully or substantially separated such that the heat exchanger(s) 41 may simultaneously accommodate ambient air and circulating gas. The heat exchanger(s) 41 may be cross flow, counter flow, parallel flow, combinations thereof, or the like.

The units 10 may each comprise one or more movement imparting devices 31. In exemplary embodiments, the movement imparting devices 31 comprise gas springs. A first and second movement imparting device 31a1, 31a2, 31b1, 31b2 may be associated with each of the subassemblies 14a, 14b for moving the subassemblies 14a, 14b between open and closed positions.

One or more open loop fans 18 may be provided. In exemplary embodiments, a series of four open loop fans 18 are aligned about a lower portion of the unit 10. However, any number of open loop fans 18 may be provided in any arrangement. The open loop fans 18 may be of a same or different type. The open loop fans 18 may be configured to move ambient air through one or more open loop airflow pathways of the units 10 when activated. The open loop fans 18 may comprise axial fans, centrifugal fans, combinations thereof, or the like. Any number or type of fans 18 may be used at any location in the units 10, and may be provided in banks or sets. Each of the fans 18 may be operated and/or controlled together or separately.

Each of the subassemblies 14 may comprise subassembly intakes 65 in fluid communication with the external openings 16 for ingesting flows of ambient air into the respective subassembly airflow pathways 23a, 23b. Each of the subassemblies 14 may comprise a subassembly exhaust 69 in fluid communication with the external openings 16 for exhausting the ambient air from the units 10. In exemplary embodiments, the open loop fans 18 may be fluidly interposed between the subassembly exhausts 69 and the exhausts 16 for the unit 10. The open loop fans 18 may be configured to ingest ambient air into the units 10, exhaust ambient air from the units 10, and/or move ingested ambient air through the one or more subassembly airflow pathways 23 and/or heat exchangers 41 when activated. The same of different open loop fans 18 may be associated with each of the subassembly airflow pathways 23 and/or the heat exchangers 41. Separate open loop fans 18 may be used for each of the multiple electronic display subassemblies 14a, 14b and/or heat exchangers 41, or the open loop fans 18 may be common to some or all of the various electronic display subassemblies 14 and/or heat exchangers 41 of such units 10.

Each of the electronic display subassemblies 14a, 14b may comprise one or more closed loop fans 20, which may be of a same or different type. The closed loop fans 20 may be configured to move circulating gas through one or more closed loop airflow pathways of the units 10 when activated. The closed loop fans 20 may comprise axial fans, centrifugal fans, combinations thereof, or the like. Any number or type of fans 20 may be used at any location in the units 10, and may be provided in banks or sets. Each of the fans 20 may be operated and/or controlled together or separately.

The open loop airflow pathways may be partitioned and/or separated from the closed loop airflow pathways, though a complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as, but not limited to, IP65, IP67, or the like. Each of the electronic display subassemblies 14a, 14b may comprise one or more partitions, gaskets, walls, panels, combinations thereof, or the like, which may provide separation between the ambient air in the open loop airflow pathways and the circulation gas in the closed loop airflow pathway(s). Alternatively, or additionally, one or more filters may be utilized between ambient air and/or circulating gas to separate between open and/or closed loop airflows.

Each subassembly 14a, 14b may comprise a number of the closed loop fans 20a, 20b, respectively. A housing 59a, 59b may be provided about some of all of the closed loop fans 20a, 20b, respectively, of a given one of the subassemblies 14a, 14b. The housings or fan tray 59 of a given one of the subassemblies 14 may be configured to accommodate all of the closed loop fans 20 the given one of the subassemblies 14. However, in other exemplary embodiments, each individual fans 20 or groups of the individual fans 20 may comprise separate housings 59. The housing 59 may be configured to permit ingestion of the circulating gas from the common passageway portions 21a, 21b and direct the ingested circulating gas in an appropriate direction, such through entrances 43 into the front passageways 26 and/or the illumination device passageway 27 of the electronic display subassembly 14, and/or out exits 45 for the same. The housings 59 may be configured to provide a relatively laminar flow within the front passageway 26 and/or the illumination device passageway 27. The fans 20 may be positioned within the housings 59 to accomplish the same. For example, without limitation, an intake for the fans 20 may be fluidly adjacent to the common passageway portions 21 and an exhaust for the fans 20 may be fluidly adjacent to the front passageway 26 and/or the illumination device passageway 27.

Each of the closed loop fans 20 may be provided proximate to the entrances 43 into one or both of the front passageway 26 and the illumination device passageway 27 for generating the flows through the front passageway 26 and the illumination device passageway 27, respectively, such as by pushing the circulating gas through the front passageway 26 and the illumination device passageway 27 when the fan(s) 20 are activated. An exhaust, relatively high-pressure side of the closed loop fans 20 may be positioned fluidly adjacent to the front passageway 26 and/or the illumination device passageway 27, so that a relatively high, positive pressure (e.g., greater than pressure of ambient air outside of the units 10) is generated for circulating gas within the front passageway 26 and the illumination device passageway 27, though such is not necessarily required. This may reduce or eliminate bowing of the electronic display layer 13 to improve optics. Alternatively, or additionally, this may reduce or eliminate tensile mechanical stresses on the electronic display layer 13 to reduce or eliminate cell breach.

In exemplary embodiments, the front passageway 26 and/or the illumination device passageway 27 may be configured to create and maintain a pressure differential between the flows of the circulating gas in the front passageway 26 and/or the illumination device passageway 27 sufficient to generate net forces at the electronic display layers 13 which reduce or eliminate bowing of the electronic display layers 13. In exemplary embodiments, the pressure of the flow in the front passageway 26 may be maintained at a higher level than the flow in the illumination device passageway 27, resulting in rearward forces against the electronic display layer 13 to reduce or eliminate outward bowing. Such pressure differentials may be generated using features including, but not limited to, those shown and/or described in U.S. Pat. No. 10,398,066 issued Aug. 27, 2019, the disclosures of which are hereby incorporated by reference as if fully restated herein.

The housing 59 for the closed loop fans 20 may comprise a generally curved shaped. A rear wall of the housing 59 may define one or more peaks to accommodate respective ones of the fans 20 and a valley between adjacent ones of the fans 20. Each housing 59 may be configured to accommodate any number of fans 20. A single or multiple closed loop fan 20 and/or housings 59 may be used with each side assembly 14. Because the closed loop fans 20, particularly when provided as centrifugal fans, may be configured to exhaust fluid in a generally pinwheel pattern (e.g., outward from a center), the curved shape of the rear wall may encourage relatively laminar flow into the front passageway 26 and/or illumination device passageway 27. The fans 20 may be spaced from the entrance 43 to the front passageway 26 and/or illumination device passageway 27 and a leading edge of the housings 59 may extend at an angle, though such is not required, to encourage flow into the front passageway 26 and/or illumination device passageway 27. The rear wall may define a generally sinusoidal shape curve by way of non-limiting example. Alternatively, or additionally, the rear wall may define a generally wave or boomerang shape. The shape of the rear wall need not be perfectly curved or smooth and may include one or more portions of which are planar.

When positioned on opposing sides of the structural framework 12, the closed loop fans 20a, 20b may be located on opposing sides of the unit 10 from one another. This may be particularly true where the electronic display subassemblies 14a, 14b are the same, or substantially the same. This arrangement may cause circulating gas exiting the subassemblies 14, such as at exits 45a, 45b for the front passageways 26 and/or illumination device passageways 27, to take a sinuous route through the units 10. In exemplary embodiments, circulating gas exiting the front passageways 26a and/or illumination device passageways 27a of a first one of the subassemblies 14a at an exit area 45a may be forced to travel through the first heat exchanger 41a in the second portion of the common passageway 21b, at least in part due to the first side septum 39a, and about the various electronic components 35b of the second subassembly 14b before reaching the entrance 43b of the second subassembly 14b. The circulating gas may then flow through either or both of the front passageway 26b and/or illumination device passageway 27b of the second side assembly 14b before exiting at the exit 45b and into the second heat exchanger 21b within the first common passageway portion 21a and about the various electronic components 35a of the first subassembly 14a before reaching the entrance 43a of the first subassembly 14a. The circulating gas may then flow through either or both of the front passageway 26a and/or illumination device passageway 27a of the first side assembly 14a and continue recirculating through the unit 10. The center septum 37 may prevent some or any cross over of the circulating gas between the common passageway portions 21a, 21b. This may force circulating gas to take a sinuous path between the first and second subassemblies 14a, 14b, increasing surface area and time for heat transfer.

A method for thermally managing the units 10 may include moving circulating gas through a closed loop airflow pathway. The closed loop airflow pathway may include one or more of: the front passageways 26, the illumination device passageways 27, the common passageway(s) 21, and the heat exchanger(s) 41. More specifically, a flow of circulating gas may begin in the front passageway 26 of a first one of the subassemblies 14a, be joined with another flow of the circulating gas traveling through the illumination device passageways 27a of the first one of the subassemblies 14a when passing through the exit 45a of the first one of the subassemblies 14a and into a second portion 21b of the common passageway 21. The combined flow may be forced through the first heat exchanger 41a by the first side septum 39a. The combined flow may be forced through the entrance 43b of the second one of the subassemblies 14b by the central septum 37, the housing 59b, and/or the closed loop fan 20b. A portion of this combined flow may first be forced about or proximate to the electronic components 35b. The combined flow may split and a portion may travel through the front passageway 26b of the second one of the subassemblies 14b and the illumination device passageway 27b of the second one of the subassemblies 14b. The flow may be recombined when traveling through the exit 45b of the second one of the subassemblies 14b. The combined flow may be forced to travel through the second heat exchanger 41b by the second side septum 39b. The combined flow may be forced through the entrance 43a of the first one of the subassemblies 14a by the central septum 37, the housing 59a, and/or the closed loop fan 20a. A portion of this combined flow may first be forced about or proximate to the electronic components 35a. The circulating gas may be repeatedly recirculated in this fashion. While separation and joinder of flows is discussed, this does not mean that the flows necessarily have the same velocity, pressure, mass flow rate, combinations thereof, or the like. For example, the same portion of the flow may not always or necessarily be rejoined, separated, or the like. Movement of the circulating gas within the closed loop airflow pathway(s) may be accomplished by activation of the closed loop fans 20.

The method may alternatively or additionally include moving ambient air through one or more open loop airflow pathways within the units 10. The open loop airflow pathways may comprise one or more of: the external openings 16, the subassembly airflow pathways 23, and the heat exchangers 41. In exemplary embodiments, without limitation, ambient air may be ingested by way of external openings 16 at an upper portion of the unit 10 and separated into flows through the subassembly airflow pathways 23a of the first subassembly 14a, the first heat exchanger 41a, the second heat exchanger 41b, and the second subassembly airflow pathways 23b. Movement of the ambient air within the open loop airflow pathway(s) may be accomplished by activation of some or all of the open loop fans 18.

In other exemplary embodiments, the central septum 37 may be omitted. The side septa 39 may provide partitions or baffles for the circulating gas in the rear passageway 21. Such embodiments may include or omit the heat exchangers 41.

The closed loop fans 20 and the open loop fans 18 may be operated at the same or different times. The ambient air may be moved through the open loop airflow pathway at the same or different time as the circulating gas is moved through the closed loop airflow pathway. Some or all of the closed loop fans 20 and the open loop fans 18 may be operated at a given time.

While the flow of circulating gas shown and/or described herein is primarily referenced with regard to a generally clockwise travel, a generally counter-clockwise travel may alternatively be utilized. This may be accomplished using the same structure, such as but not limited to, location of the entrances 43, exits 45, closed loop fans 20, and/or heat exchangers 41, and the closed loop fans 20 may be instead operated in reverse or installed in an opposing orientation. Alternatively, a generally counter-clockwise directional flow may be accomplished with a different structure, such as by reversing the location of the entrances 43, exits 45, closed loop fans 20, and/or heat exchangers 41.

While the flow of ambient air shown and/or described herein is primarily referenced with regard to a top-to-bottom flow arrangement, a generally bottom-to-top flow may alternatively be utilized. This may be accomplished using the same structure, such as but not limited to, location of the open loop fans 18 may be instead operated in reverse or installed in an opposing orientation. Alternatively, a generally bottom-to-top flow may be accomplished with a different structure, such as by placing the open loop fans 18 proximate to an upper portion of the units 10.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly with divided interior space, said display assembly comprising:
   a first and second electronic display subassembly, each comprising a passageway for gas;
   a common passageway for the gas fluidly connected with the passageways of the first and second electronic display subassemblies, said common passageway, said passageway of said first electronic display subassembly, and said passageway of said second electronic display subassembly forming, at least in part, a continuous airflow pathway for the gas; and
   a central septum comprising one or more angled surfaces extending within the common passageway to prevent the gas from directly traveling between a first portion and a second portion of the common passageway, where the first and second portions are defined, at least in part, by the central septum, and where each of the first portion and the second portion are fluidly connected with the passageways of the first and second electronic display subassemblies.

2. The display assembly of claim 1 further comprising:
   a first side septum extending within the first portion of said common passageway; and a second side septum extending within the second portion of said common passageway.

3. The display assembly of claim 2 wherein:
each of said first and second electronic display subassembly comprise a cover and an electronic display layer;
said passageway of said first electronic display subassembly is located between said cover and said electronic display layer of said first electronic display subassembly; and
said passageway of said second electronic display subassembly is located between said cover and said electronic display layer of said second electronic display subassembly.

4. The display assembly of claim 3 wherein:
an entrance to said passageway of said first electronic display subassembly is adjacent to said first portion of said common passageway;
an exit to said passageway of said second electronic display subassembly is adjacent to said first portion of said common passageway;
an entrance to said passageway of said second electronic display subassembly is adjacent to said second portion of said common passageway; and
an exit to said passageway of said first electronic display subassembly is adjacent to said second portion of said common passageway.

5. The display assembly of claim 4 wherein:
each of said first and second electronic display subassemblies comprise illumination devices located rearward of said electronic display layer to provide direct backlighting to said electronic display layer when activated; and
each of said first and second electronic display subassemblies comprise an additional passageway located between said electronic display layer and said illumination devices which is in fluid communication with said common passageway and forming part of said continuous airflow pathway.

6. The display assembly of claim 1 wherein:
said continuous airflow pathway is partitioned from an ambient environment.

7. The display assembly of claim 6 further comprising:
said continuous airflow pathway is partitioned from said ambient environment in accordance with at least ingress protection code IP 65 or higher.

8. The display assembly of claim 6 further comprising:
at least one open loop airflow pathway for ambient air extending within the display assembly.

9. The display assembly of claim 8 further comprising:
a first heat exchanger located within said first portion of said common passageway, said first heat exchanger forming part of said continuous airflow pathway and said at least one open loop airflow pathway; and
a second heat exchanger located within said second portion of said common passageway, said second heat exchanger forming part of said continuous airflow pathway and said at least one open loop airflow pathway.

10. The display assembly of claim 9 wherein:
said at least one open loop airflow pathway comprises a first open loop airflow pathway extending within the first electronic display subassembly and a second open loop airflow pathway extending within the second electronic display subassembly.

11. The display assembly of claim 1 further comprising:
a first set of electronic components for operating the first electronic display subassembly located within said first portion of said common passageway; and
a second set of electronic components for operating the second electronic display subassembly located within said second portion of said common passageway.

12. The display assembly of claim 1 wherein:
each of said first and second electronic display subassemblies are moveably mounted to a structural framework supporting said first and second electronic display subassemblies.

13. The display assembly of claim 1 further comprising:
one or more fans located within the continuous airflow pathway for moving the gas when activated.

14. The display assembly of claim 1 wherein:
each of said first and second electronic display subassemblies comprises a liquid crystal type display.

15. A method for thermally managing a display assembly having a divided interior space, said display assembly comprising:
activating one or more fans to move gas through a continuous airflow pathway comprising a passageway of each of a first and second electronic display subassembly and a common passageway fluidly connected with the passageways of the first and second electronic display subassemblies, wherein a central septum comprising one or more angled surfaces extends within the common passageway to prevent the gas from directly traveling between a first portion and a second portion of the common passageway, where the first and second portions are defined, at least in part, by the central septum, and where each of the first and the second portions are fluidly connected to the passageway of each of the first and second electronic display subassemblies.

16. A display assembly with divided interior space, said display assembly comprising:
electronic display subassemblies, each comprising an airflow passageway for gas;
a common passageway for the gas fluidly connecting the airflow passageways of the electronic display subassemblies such that a continuous airflow pathway is formed comprising the common passageway and the airflow passageway of each of the electronic display subassemblies; and
a central septum comprising one or more angled surfaces extending within the common passageway to prevent the gas from directly traveling between portions of the common passageway, where the portions are defined, at least in part, by the central septum, and where each of the portions are fluidly connected to the airflow passageway of each of the electronic display subassemblies.

17. The display assembly of claim 16 further comprising:
side septa, each extending within one of the portions of said common passageway.

18. The display assembly of claim 16 wherein:
each of said electronic display subassemblies comprise a cover and an electronic display layer; and
each of said passageways are located between said cover and said electronic display layer of the respective electronic display subassembly.

19. The display assembly of claim 16 wherein:
an entrance and an exit of each of said passageways are fluidly adjacent to a different one of said portions of said common passageway.

20. The display assembly of claim 16 wherein:
each of said electronic display subassemblies comprises a liquid crystal type display.

\* \* \* \* \*